United States Patent [19]

DiStefano et al.

[11] Patent Number: 5,801,446
[45] Date of Patent: Sep. 1, 1998

[54] MICROELECTRONIC CONNECTIONS WITH SOLID CORE JOINING UNITS

[75] Inventors: Thomas H. DiStefano, Monte Sereno; Vernon Solberg, Saratoga, both of Calif.

[73] Assignee: Tessera, Inc., San Jose, Calif.

[21] Appl. No.: 411,472

[22] Filed: Mar. 28, 1995

[51] Int. Cl.[6] .................. H01L 23/12; H01L 23/50; H01L 23/14
[52] U.S. Cl. .............. 257/778; 257/738; 257/772; 257/777; 257/779
[58] Field of Search ................... 257/778, 772, 257/777, 779, 780, 738, 723, 730

[56] References Cited

U.S. PATENT DOCUMENTS

| | | | |
|---|---|---|---|
| 3,303,393 | 2/1967 | Hymes et al. | 317/101 |
| 3,797,103 | 3/1974 | Desmond et al. | 29/583 |
| 3,871,015 | 3/1975 | Lin et al. | 257/778 |
| 4,606,962 | 8/1986 | Reylek et al. | 428/148 |
| 4,788,767 | 12/1988 | Desai et al. | 29/830 |
| 4,797,103 | 1/1989 | Pittman | 434/211 |
| 4,818,728 | 4/1989 | Rai et al. | 257/777 |
| 4,857,482 | 8/1989 | Saito et al. | 257/737 |
| 4,937,006 | 6/1990 | Bickford et al. | 228/219 |
| 5,065,227 | 11/1991 | Frankeny et al. | 257/778 |
| 5,070,297 | 12/1991 | Kwon et al. | 324/158 P |
| 5,090,609 | 2/1992 | Nakao et al. | 257/778 |
| 5,093,986 | 3/1992 | Mandai et al. | 29/843 |
| 5,103,290 | 4/1992 | Temple et al. | 257/774 |
| 5,115,964 | 5/1992 | Ameen et al. | 228/219 |
| 5,133,495 | 7/1992 | Angulas et al. | 228/180.1 |
| 5,135,890 | 8/1992 | Temple et al. | 257/133 |
| 5,148,265 | 9/1992 | Khandros et al. | 257/773 |
| 5,148,266 | 9/1992 | Khandros et al. | 257/773 |
| 5,154,341 | 10/1992 | Melton et al. | 228/180.22 |
| 5,233,504 | 8/1993 | Melton et al. | 257/690 |
| 5,300,340 | 4/1994 | Calhoun et al. | 428/40 |
| 5,316,787 | 5/1994 | Frankeny et al. | 427/97 |
| 5,347,159 | 9/1994 | Khandros et al. | 257/692 |
| 5,376,584 | 12/1994 | Agarwala | 437/183 |
| 5,394,490 | 2/1995 | Kato et al. | 257/778 |
| 5,448,114 | 9/1995 | Kondoh et al. | 257/778 |

FOREIGN PATENT DOCUMENTS

| | | | |
|---|---|---|---|
| 0266037 | 9/1992 | Japan | 257/778 |
| 0273464 | 9/1992 | Japan | 257/778 |
| 0061368 | 3/1994 | Japan | 257/778 |

OTHER PUBLICATIONS

McCormick, John E., "Metals Joining of Electronic Circuitry", pp. 13–1; 13–30—13–53, ©1970 by McGraw–Hill, Inc.

Bottcher, M., Rzepka, S. and Sadowski, G., "High density flexible circuits with solder ball arrays", Flexcon™ '94, 1994, ©1994 Semiconductor Technology Center, Inc., pp. 7–16.

Flip Chip Technology, A Technology Impact Report Jun. 1992, International Interconnection Intelligence Flip Chip Technology.

Neugebauer, CA et al., MCT Packaging, pp. 908–911.

*Multichip Module Technologies and Alternatives: The Basics*, "9.6 Flip Chip Solder Bump (FCSB) Technology: An Example", by Karl J. Puttlitz, Jr., pp. 450–476, ©1993 by Van Nostrand Reinhold.

*Primary Examiner*—Tom Thomas
*Assistant Examiner*—Alexander Oscar Williams
*Attorney, Agent, or Firm*—Lerner, David, Littenberg, Krumholz & Mentlik

[57] ABSTRACT

A microelectronic component such as a semiconductor chip having electrical contacts is provided with terminals, the terminals being movable relative to the component. A joining unit having a solid core is disposed on each terminal and extends upwardly, away from the component. Each unit includes a bonding material such as a solder bonding the terminal and the solid core, the bonding material desirably defining a waist or narrow section spaced above the terminal, the waist having a curved surface forming a stress-relieving fillet. The joining units are bonded to contact pads of a substrate such as a circuit panel as by bonding the solder of the joining units to the terminals, or by means of a further solder on the contact pads having a lower melting point. The assembly provides substantial resistance to mechanical stress caused by thermal expansion. Preferably, the terminals are movable in vertical directions towards the component to compensate for nonplanarity during assembly.

27 Claims, 3 Drawing Sheets

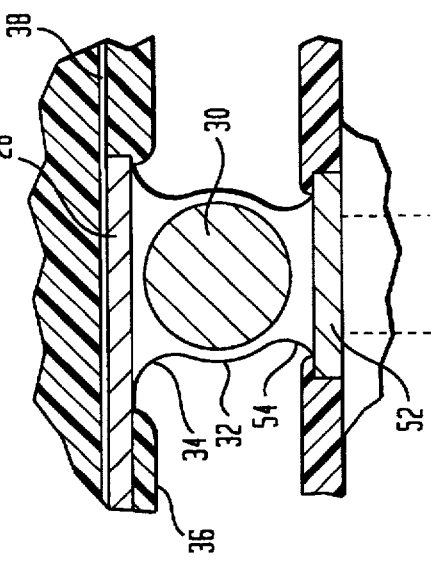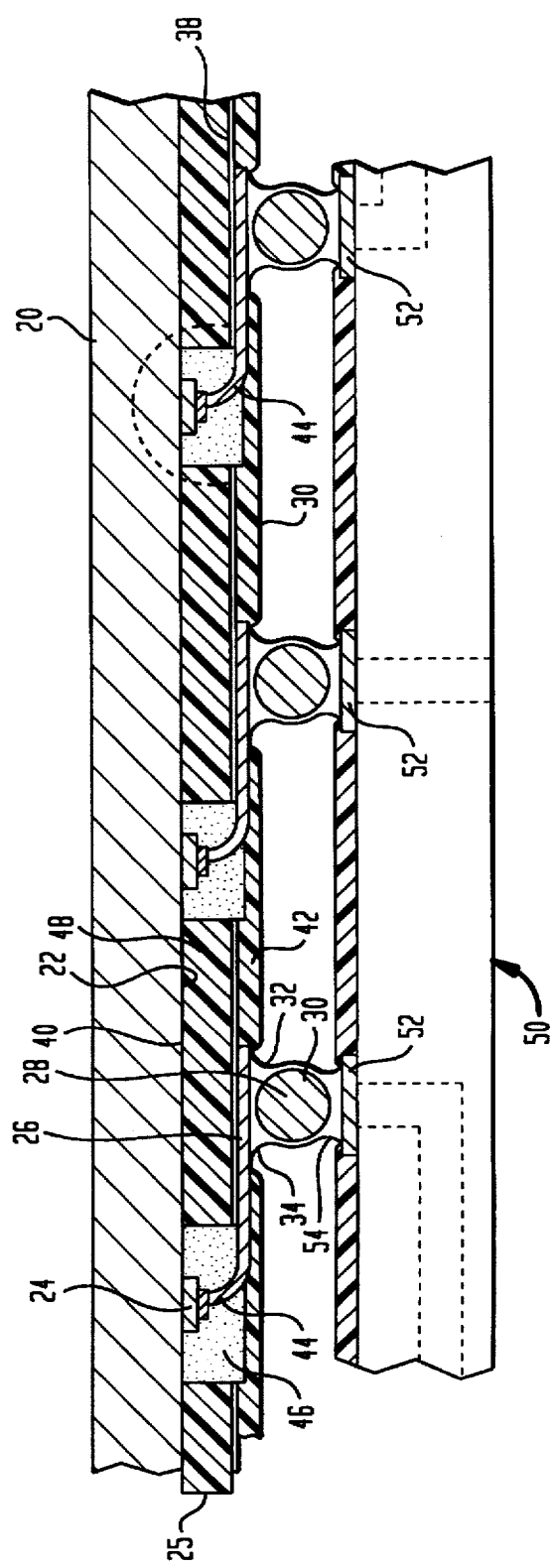

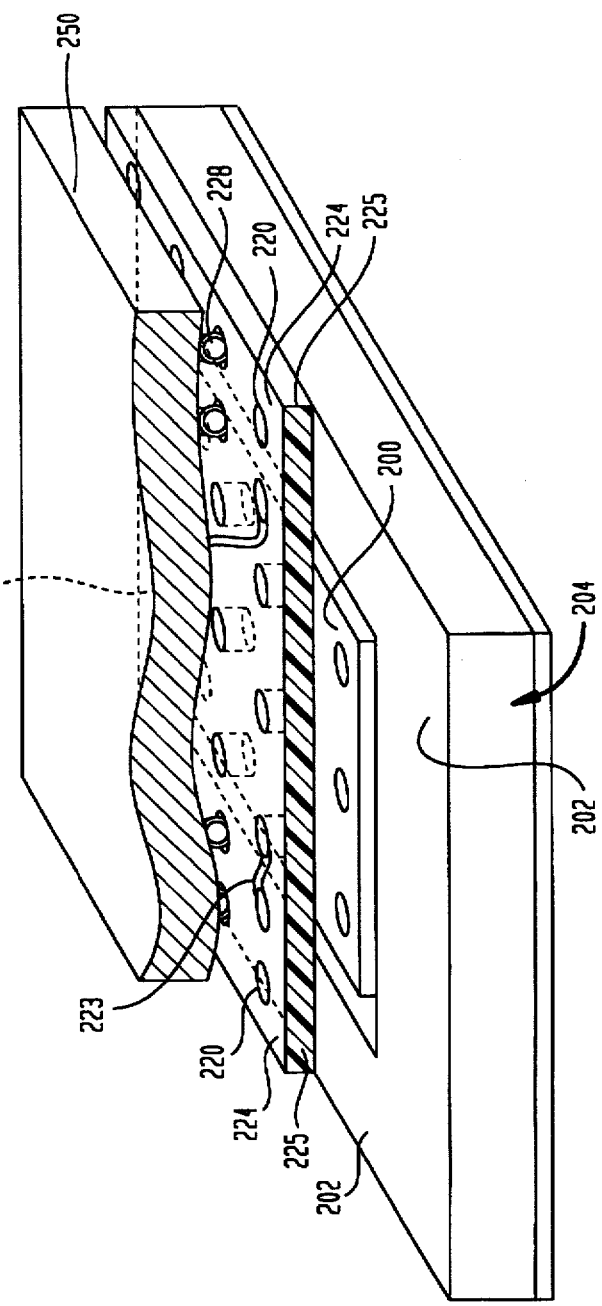

MICROELECTRONIC CONNECTIONS WITH SOLID CORE JOINING UNITS

BACKGROUND OF THE INVENTION

The present invention relates to the art of electronic packaging, and more specifically to assemblies incorporating microelectronic components and to methods of making such assemblies.

Modern electronic devices utilize microelectronic components, commonly referred to as "integrated circuits" which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with a reliable electrical interconnection to the substrate. The interconnection between the chip itself and the supporting substrate is commonly referred to as "first level" assembly or chip interconnection, as distinguished from the interconnection between the substrate and the larger elements of the circuit, commonly referred to as "second level" interconnection.

The first level interconnection structures connecting a chip to a substrate ordinarily are subject to a substantial stress caused by thermal cycling as temperatures within the device change during operation. The electrical power dissipated within the chip tends to heat the chip and substrate, so that the temperature of the chip and the substrate rises each time the device is turned on and falls each time the device is turned off. As the chip and the substrate ordinarily are formed from different materials having different coefficients of thermal expansion, the chip and the substrate ordinarily expand and contract by different amounts. This causes the electrical contacts on the chip to move relative to the electrical contact pads on the substrate as the temperature of the chip and the substrate changes. This relative movement deforms the electrical interconnections between the chip and the substrate and places them under mechanical stress. These stresses are applied repeatedly with repeated operation of the device, and can cause breakage of the electrical interconnections. Thermal cycling stresses may occur even when the chip and substrate are formed from like materials having similar coefficients of thermal expansion, because the temperature of the chip may increase more rapidly than the temperature of the substrate when power is first applied to the chip.

Flip-chip bonding provides a method for interconnection. In flip-chip bonding, contacts on the surface of the chip are provided with bumps of solder. The substrate has contact pads arranged in an array corresponding to the array of contacts on the chip. The chip, with the solder bumps, is inverted so that its front surface faces towards the top surface of the substrate, with each contact and solder bump on the chip being positioned on the appropriate contact pad of the substrate. The assembly is then heated so as to liquefy the solder and bond each contact on the chip to the confronting contact pad of the substrate. Because the flip-chip arrangement does not require leads arranged in a fan-out pattern, it provides a compact assembly. The area of the substrate occupied by the contact pads is approximately the same size as the chip itself. Moreover, the flip-chip bonding approach is not limited to contacts on the periphery of the chip. Rather, the contacts on the chip may be arranged in a so-called "area array" covering substantially the entire front face of the chip. Flip-chip bonding therefore is well-suited to use with chips having a large number of I/O contacts.

Early flip-chip connections, as shown in U.S. Pat. No. 3,303,393, incorporated copper core solder balls, each including a sphere of copper coated with a solder. One such solder ball was provided between each contact on the chip and each contact pad on the substrate. These connections worked well for small devices. With larger devices having greater differential thermal expansion, the rigid connections provided by the solid core solder balls tended to crack. Warpage or distortion of the chip or substrate made it difficult to engage all of the solid core solder balls between the chip and substrate simultaneously, or to engage all of the solid core solder balls between the chip and a test fixture.

Other flip-chip bonding techniques, commonly referred to as "controlled collapse chip connection" or "C4" bonding, utilized masses of relatively soft, high-lead solder, typically containing between 90 and 97 percent lead. The high lead solder forms a somewhat less rigid connection than the solid core solder balls, Deformation of the solder connection relieves the stresses caused by differential thermal expansion to some degree. However, assemblies made by flip-chip bonding with the C4 process are still susceptible to thermal stresses. The degree of flexibility provided by the high-lead solder connections is limited. The solder joints and may be subject to very high stress upon differential expansion of the chip and substrate. These difficulties are particularly pronounced with relatively large chips. An article entitled "Flip Chip Solder Bump (FCSB) Technology: An Example" by Karl J. Puttlitz, Sr., describes these problems. Moreover, it is difficult to test and operate or "burn-in" chips having an area array of contacts before attaching the chip to the substrate. Where the chips are provided with high-lead solder balls suitable for the C4 process and then clamped to a socket to engage the solder balls with test contacts, the solder creeps and deforms rapidly. It is also difficult to rework a chip bonded using the C4 process. Parts of the solder masses are removed from the contacts if the chip is separated from the substrate, leaving non-uniform partial solder masses on the chip contacts.

Commonly assigned U.S. Pat. Nos. 5,148,266 and 5,148,265, the disclosures of which are hereby incorporated by reference herein, provide substantial solutions to the problem of thermal stresses. Nonetheless, still further improvements would be desirable.

SUMMARY OF THE INVENTION

The present invention provides such further improvements.

A microelectronic assembly according to one aspect of the invention includes a microelectronic component having a top surface with a plurality of electrical contacts in a pattern on the top surface. The microelectronic assembly according to this aspect of the invention also includes a plurality of terminals overlying the top surface. Each terminal is connected to at least one contact of the component and is movable with respect to the component. Desirably, each terminal is movable in lateral or horizontal directions parallel to the top surface of the component. Most preferably, each terminal is also vertically displaceable towards the top surface. A compliant layer such as a gel, an elastomer or an adhesive having a low elastic modulus may be disposed between the terminals and the top surface of the microelectronic component to permit movement of the terminals relative to the component. A flexible dielectric film may be on the compliant layer, and the terminals may be secured to the dielectric film and are connected to the contacts by flexible electrically conductive leads.

The microelectronic assembly further includes a plurality of joining units, each including a solid core which is preferably spherical. Each solid core is disposed on one terminal and extends upwardly from such terminal. The assembly also includes a unit bonding material such as a solder. The unit bonding material extends between the terminal and core. Preferably, the unit bonding material is provided as a part of the joining unit, as a coating extending over the solid core. The solder or unit bonding material may define a terminal-side waist at which the horizontal dimensions of the solder are at a minimum. Each terminal-side waist desirably is spaced above its associated terminal.

Preferred structures according to this aspect of the present invention facilitate connection of the joining units to contact pads on a substrate such as a circuit panel and enable the resulting assembly to resist stresses resulting from differential thermal expansion. The vertical movability of the terminals facilitates engagement of the joining units with the contact pads on the substrate. Even where the microelectronic element and the substrate are distorted or misaligned, the terminals and joining units can be displaced vertically and can conform to the substrate, to bring all of the joining units into engagement with all of the contact pads simultaneously. This can be accomplished without distorting the joining units, the component or the substrate.

Differential thermal expansion and contraction of the microelectronic component and substrate can be accommodated by horizontal movement of the terminals with respect to the contacts on the component. Horizontal forces applied to the solder connections tending to move the terminals relative to contact pads of the substrate are minimized. The compliant layer facilitates horizontal movement of the terminals relative to the component. Where the terminals are disposed on the compliant layer, or on a flexible dielectric layer disposed over the compliant layer, the compliant layer can distort to accommodate the horizontal movement of the terminals. Stated another way, the compliant layer decouples the terminals from the component.

In the preferred structures according to this aspect of the invention, the horizontal and vertical displacability of the terminals relative to the microelectronic component eliminates the requirement that the joining units themselves be soft and yieldable, and thus permits use of joining units with rigid cores.

Moreover, the joining units provide a configuration which is inherently resistant to such horizontal forces. The core reinforces the joining unit. The joining unit desirably has a curved surface in the vicinity of the terminal. The curved surface acts as a fillet and reduces or eliminates the stress concentration present which would otherwise exist at the interface between the joining unit and the terminal. Although the present invention is not limited by any theory of operation, it is believed that the interface is weaker than the other parts of the joint because brittle, fatigue-susceptible intermetallic compounds form at the interface. Therefore, reduction in stress concentration at the interface enhances the stress resistance of the joint as a whole. By contrast, in conventional connections the waist is a sharp notch disposed at the interface between the joining unit and the terminal. There is a substantial stress concentration at the interface.

A further aspect of the present invention provides methods of making a microelectronic assembly. A method according to this aspect of the present invention preferably includes the step of providing a starting subassembly which includes a microelectronic component having electrical contacts. A plurality of terminals overly the top surface of the component. Each terminal is supported above the plane of the component top surface connected to at least one contact of the component. Thus, the subassembly may include a compliant layer as discussed above, and may also include a flexible film overlying the compliant layer, the terminals being disposed on the film. Each terminal desirably is movable with respect to the component horizontally in directions parallel to the top surface. More preferably, each terminal is also movable in vertical directions perpendicular to the top surface.

The method desirably also includes the steps of positioning a plurality of joining units, each including a solid core on the terminals, and providing a unit bonding material such as a first solder at the interfaces between the cores and terminals and then heating the assembly to convert the unit bonding material to a liquid phase without melting the core. As a result the unit bonding material forms a bond between the core of each joining unit and the terminal. The unit bonding material has a first melting temperature. Preferably, the step of providing the unit bonding material is performed by providing the unit bonding material as a part of each joining unit, such as a coating overlying the solid core. The method may further include the step of juxtaposing a proximal or first substrate with the starting subassembly and joining units and bonding the joining units to electrical contact pads on the proximal substrate. This step desirably is performed by providing a pad bonding material such as a second solder having a second melting temperature lower than the first melting temperature at the juxtaposed joining units and contact pads, and heating the assembly to a working temperature above the second melting temperature but below the first melting temperature. The method desirably is performed repeatedly, to make a plurality of assemblies. The assemblies are then inspected and any assemblies which fail inspection are reworked by heating them to a disassembly temperature above the second melting temperature of the pad bonding material but below the first melting temperature and pulling the substrate away from the first element. The joining units remain with the starting subassembly, so that the subassembly may be reused.

In a particularly preferred arrangement, each terminal may incorporate a seat in substantially in the form of a surface of revolution about an axis, such as a substantially conical seat, and may further include a circular rim surrounding the seat. The core of each joining unit may be substantially spherical. Each core will tend to center itself in the associated seat during the soldering process. This facilitates accurate engagement of the joining units with the terminals on the substrate during use of the subassembly, and also provides mechanical reinforcement to the connection.

These and other objects, features and advantages of the present invention will be more readily apparent from the detailed description of the preferred embodiment set forth below and taken in connection with the accompanying drawings.

BRIEF DESCRIPTION OF THE DRAWINGS

FIG. 1 is a fragmentary sectional view of an assembly in accordance with one embodiment of the invention.

FIG. 2 is a fragmentary view, on an enlarged scale of the area indicated in FIG. 1.

FIG. 4 is a diagrammatic, cutaway perspective view depicting an assembly in accordance with a further embodiment of the invention.

FIG. 5 is a fragmentary view depicting a portion of an assembly in accordance with yet another embodiment of the invention.

DETAILED DESCRIPTION OF THE PREFERRED EMBODIMENTS

Figure 3:
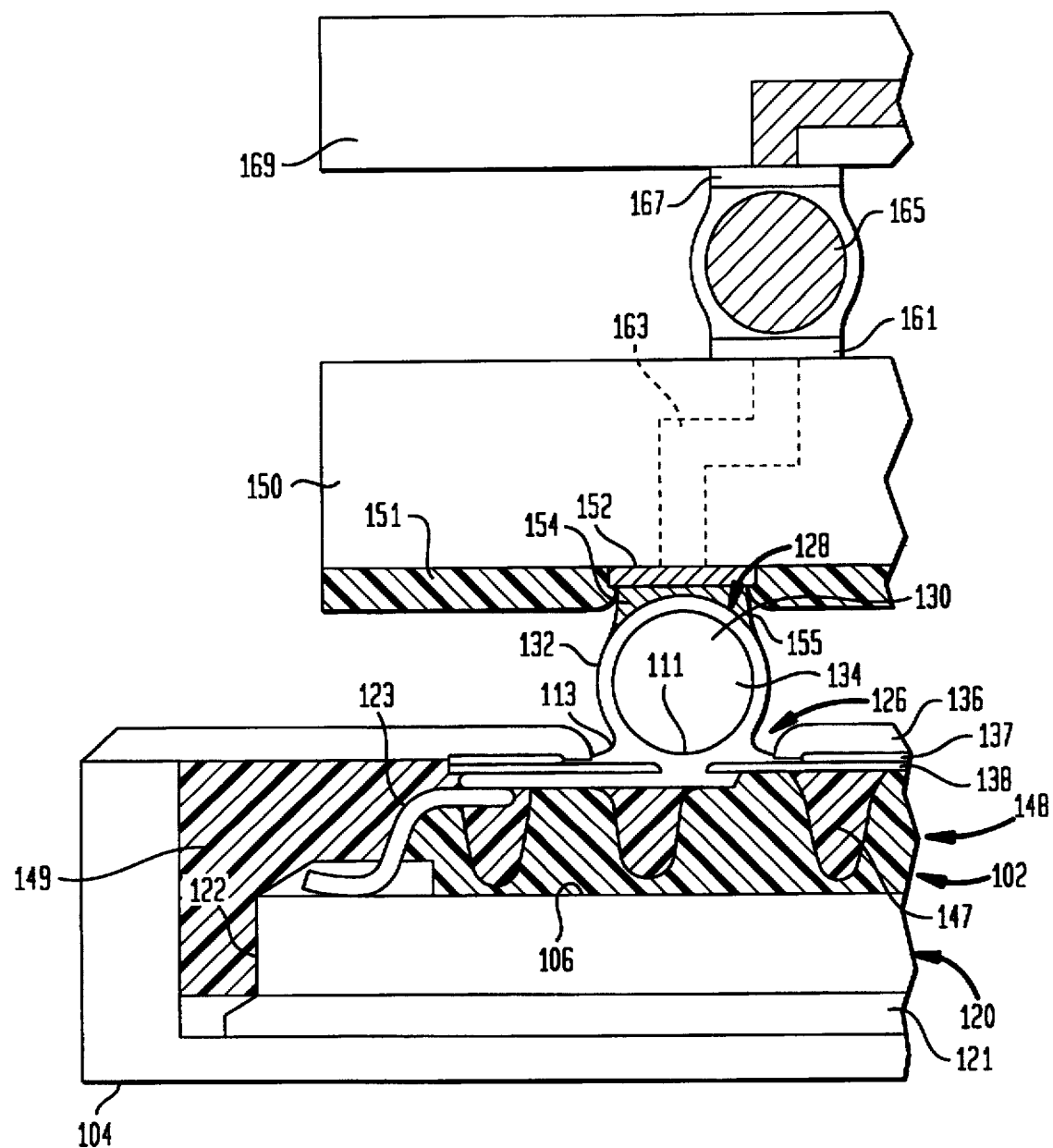
FIG. 3 is a fragmentary view, similar to FIG. 2, but depicting a subassembly in accordance with a further embodiment of the invention.

A microelectronic assembly in accordance with one embodiment of the present invention includes a microelectronic component or chip 20 having a top surface 22 and electrical contacts 24 on such surface. The electrical contacts 24 are electrically connected to the internal electronic components (not shown) of component 20.

The assembly also includes a chip carrier 25. Chip carrier 25 includes a dielectric support structure including a compliant layer 48 formed from an elastomer, gel, adhesive or other soft material and a flexible but substantially inextensible dielectric film 38 on the compliant layer 48. The support structure has a first generally planar surface 40 defined by the compliant layer 48 facing toward component 20 and a second generally planar surface 42 defined by the film 38 facing in the opposite direction, away from component 20.

The support structure has terminals 26 mounted on the second surface 42. The support structure and terminals 26 overly the top surface 22 of the component 20. Terminals 26 desirably are disposed in a grid pattern or area array on the dielectric film. The "pitch" or distance between adjacent terminals desirably is between about 0.5 mm and 1.5 mm. Each terminal 26 is connected to at least one electrical contact 24 of the component 20 but is movable both laterally in the horizontal direction parallel to the top surface 22 and vertically, in directions perpendicular to the top surface 22 with respect to the component 20. The horizontal directions are commonly referred to as the "x" and "y" directions, whereas the vertical directions are referred to as the "z" directions. Each terminal 26 is associated with one of the electrical contacts 24 on the microelectronic component 20 and connected to the contact 24 by a flexible lead 44. The flexible leads 44 and film 38 can flex to permit horizontal movement and the compliant layer 48 can deform to permit vertical displacement of each terminal 26 independently of the others. The structure of the chip carrier and terminals, including the compliant layer, the dielectric film, the leads and their connections to the contacts of the microelectronic component may be as described in the aforementioned commonly assigned patents and publications. As described therein, many different materials may be employed to form the film, compliant layer, terminals and leads of chip carrier 25. Merely by way of example, film 38 may be a layer of polyimide about 25 to about 50 microns thick; compliant layer 48 may be about 100 to about 250 microns thick, and may be formed from a silicone material such as that sold under the registered trademark Sylgard 577 by the Dow Corning Corporation, whereas the leads and terminals may be formed from metals such as copper or gold. As further described in the aforementioned commonly assigned patents and publications, the microelectronic component may have contacts in many different configurations, and the placement of the leads and terminals may be varied to suit the locations of the contacts on the component. For example, where the contacts on the component are disposed in rows along the edges of the component, the leads may extend outwardly from terminals 26 to the edges of the film or to slots or windows in the film aligned with such rows.

A solder mask layer 36 surrounds each terminal 26 so that each terminal 26 is exposed through an aperture 46 in the solder mask layer 36. The solder mask layer 36 is formed from conventional solder mask material. The solder mask 36 is preferably made of a dielectric material, such as a laminate of release film, ½ mil adhesive and ½ mil polyimide or stand-alone adhesive with release film on each side which can be vacuum laminated. A photosensitive polymer film may be employed to permit formation of holes by photographic processes. The preferred material for the solder mask 36 is Dupont VACREL 8100, which exhibits the desirable photosensitive and dielectric properties. The solder mask 36 is not wettable by molten solder, and thus prevents solder applied to one terminal from flowing to the next adjacent terminal 26.

A plurality of joining units 28 are disposed on the terminals 26. Each joining unit 28 includes a spherical solid core 30 having diameter less than the pitch or distance between adjacent terminals. Preferably, each core is between about 0.25 mm and about 0.5 mm in diameter. All of the cores used in a particular assembly should be, of substantially the same diameter. The cores may be formed from an electrically conductive material, desirably a metal such as copper, silver, nickel and alloys and combinations thereof. Nickel and nickel alloy cores are particularly preferred because they do not tend to form intermetallic compounds with common solders. Each joining unit further includes a layer of a unit bonding material or solder 32 such as an alloy of lead and tin covering the core. Solder 32 is adapted to bond to the metal of the core and to the metals used in terminals 26. Solder 32 has a melting temperature substantially lower than the solidus temperature of cores 30. As used in this disclosure, the term "solidus temperature" refers to the temperature which the core can withstand while remaining in the solid state, without substantial melting or decomposition.

The subassembly is made in a fabrication process according to a further embodiment of the invention. In this process, the joining units are disposed on terminals 26 so that the core of each joining unit is substantially centered on one terminal and so that each such core extends vertically upwardly from the associated terminal. The cores and terminals, and typically the other components as well, are brought to an elevated temperature above the melting point of solder layer 32 but below the solidus temperature of cores 30. The solder layer 32 of each unit melts and wets both the core and the terminal, and thus forms a continuous layer extending from the periphery of the terminal inwardly towards the core and covering the entire core. Conventional fluxes can be employed in this stage of the process. Because the molten solder does not wet solder mask layer 36, the solder from each unit is confined to only the terminal associated with that unit. Under the influence of surface tension, the solder layer forms a surface of revolution about a vertical axis through the center of core 30, perpendicular to the plane of terminal 26. The surface of revolution formed by the solder layer tapers radially inwardly, toward the vertical axis from the edge of terminal to a terminal-side waist 34. At the terminal-side waist 34, the horizontal dimensions of the solder 32 are at a minimum. The solder surface curves smoothly outwardly at the terminal-side waist to a wide region surrounding the center of the core. Each terminal-side waist 34 is spaced above the terminal 26.

The microelectronic assembly further comprises a substrate or second microelectronic element 50 having contact pads 52 in an arrangement corresponding to the arrangement of terminals 26 on the first element or subassembly. Substrate 50 may be any chip mounting substrate such as a ceramic body having internal circuitry, a reinforced polymeric structure, a conventional circuit board, or the like. In an assembly process, the subassembly described above is juxtaposed with the substrate or second element 50 so that contact pads 52 are aligned with the joining units 28 and terminals 26. These elements are forcibly engaged with one another, as by biasing the microelectronic element or chip 20 of the subassembly towards substrate 50. Each joining unit 28 is engaged with one contact pad 52. Normally, at least some of the terminal 26 and the associated joining units 28 are displaced vertically to facilitate engagement of all the joining units 28 with all of the contact pads 52. For example, where the substrate 50 or component 20 deviates from true planarity, or where some of the solid cores 30 differ in size from others, some of the terminals 26 will be displaced to a greater extent than others. Such displacement can be accomplished without compression of the joining units themselves and without imposing high forces at any point on the substrate or on microelectronic element 20.

The solder 32 of each joining unit 28 is bonded to the contact pad 52 by heating the joining units to an elevated temperature above the melting point of solder 32 but below the solidus temperature of cores 30. Heat may be applied before or during the juxtaposing step to the joining units alone, to substrate 50 alone, or to the entire assembly. The solder 32 of the joining units melts and wets contact pads 50, forming a further outwardly-flaring portion of the solder body defining a pad-side waist 54 remote from the contact pad 52. FIG. 2 shows an enlarged view of the terminal-side waist 34 and the pad-side waist 54.

The microelectronic assembly has substantial resistance to fatigue caused by differential thermal expansion. As differential thermal expansion of component 20 and substrate 50 occurs, terminals 26 move relative to the contacts 24 as taught in U.S. Pat. Nos. 5,148,266 and 5,148,265. This substantially reduces horizontally-directed forces which would otherwise be applied through the terminals, solder bodies and contact pads as a result of such differential thermal expansion. Moreover, because terminal-side waist 34 and pad-side waist 54, provide substantial radii on the exterior surfaces of the solder body, they do not create significant stress concentrations. The exterior surfaces of the solder body form surfaces of revolution flaring gradually outwardly from the waists toward the pads and terminals. These surfaces of revolution gradually increase in diameter adjacent the interfaces of the solder body with the pads and terminals, thereby providing fillets at the interfaces. These fillets minimize stress concentration at the interfaces.

As will be appreciated, numerous variations and combinations of the features discussed above can be utilized without departing from the present invention as defined by the claims. In one such variant, the subassembly can be tested after application of joining units 28 but before assembly of the substrate, as by engaging the joining units with contact pads of a test fixture. The vertical displaceability of terminals 26 facilitates simultaneous engagement of all of the joining units with all of the contacts of the test fixture. In a further variant, the substrate itself may be used as a test fixture. The joining units may be engaged with the contact pads of the substrate, and the assembly may be actuated in test operation, before melting the solder to bond with the contact pads.

An assembly according to a further embodiment of the invention is depicted in FIG. 3. This assembly includes a subassembly 102 incorporating a microelectronic component 120 having contacts 122; a plurality of terminals 126 (of which only one is visible in FIG. 3) mounted on a flexible dielectric sheet 138 and connected to the contacts 122 of component 120 by flexible leads 123. Here again, terminals 126 are supported above component 120 by a compliant layer 148. Layer 148 is a composite incorporating a plurality of bumps 147 formed from an elastomeric or gel material on the undersurface of dielectric sheet 138 and a further gel or elastomeric material 149 injected as a liquid between the dielectric sheet 138 and component 120. Subassembly 102 incorporates a metallic heat sink and housing 104 surrounding the component, housing 104 having an opening on its top side, overlying the top surface 106 of component 120. The housing is bonded to the bottom surface of component 120 by a thermally conductive material 121. A solder mask layer 136 overlies the top surface of dielectric film 138. This solder mask layer extends outwardly from the dielectric film to housing 104. In fabrication of the subassembly, dielectric material 14 is injected between the film 138 and component 120, and between solder mask layer 136 and housing 104 and cured so as to form an integral part of compliant layer 148. As further described in co-pending, commonly assigned U.S. patent application No. 08/123,882, the disclosure of which is hereby incorporated by reference herein, terminals 126 can be brought to a substantially co-planar alignment by engaging all of the terminals with a platen and compressing them towards the component 120 prior to injecting the additional compliant material 149.

Each terminal 126 incorporates a generally planar, circular rim 113 surrounding the central vertical axis 110 of the terminal, and a seat or via liner 111 in the form of a surface of revolution about axis 110, which in this embodiment is a conical surface. The seat 111 defines a circular opening at the center of rim 113. Seat or via liner 111 extends to the bottom surface of dielectric film 138 and merges with the associated lead 123 on such bottom surface. The subassembly further includes a metallic layer 137 disposed between the solder mask layer 136 and the top surface of dielectric film 138. Metallic layer 137 extends over the entire top surface of the dielectric film 138 except at the areas occupied by terminals 126. The metallic layer is separated from terminals 126 by small gaps surrounding each terminal. The metallic layer can be used as a ground layer or other reference potential layer. One or more of terminals 126 can be connected to the potential plane layer, as by omitting the gap surrounding the terminal or by providing small bridges extending across the gap, to provide connections for reference potential.

In fabrication of the subassembly, joining units 128, each incorporating a layer of a unit bonding material or first solder 132 over a solid core 130 are applied to terminals 126, and the joining units and terminals are brought to an elevated temperature above the melting temperature of the first solder but below the solidus temperature of core 130. In the same manner as discussed above, the molten first solder wets terminals 126 and bonds the joining unit with the terminals. As discussed above, the first solder forms a terminal-side waist above the rim 113 of terminal 126. Moreover, the core 130 becomes engaged within the conical seat 111. Although the present invention is not limited by any theory of operation, it is believed that the surface tension forces applied by the solder to the core tend to force the core downwardly to the seat and thus assure that the core is accurately centered. This action is facilitated where the diameter at the waist of the joining unit is approximately equal to or less than the diameter of the solid metal core. For spherical cores of about 0.25 mm to 0.5 mm in diameter, first solder 132 may be provided as a coating about 25μ to about 50μ thick on the surface of the core. It is believed that limiting the solder volume tends to prevent the core 130 from floating in the molten solder during the attachment process.

After the subassembly has been fabricated as described above, it is engaged with a proximal substrate 150 having contact pads 152 thereon, and also having a solder mask 151 surrounding the terminals. The proximal substrate further has interconnect pads 161 electrically connected to contact pads 152 by internal circuitry 163 within the proximal substrate. The proximal substrate or second element 150 is also provided with a second solder or pad bonding material 154 on each contact pad 152. The second solder has a melting temperature lower than the melting temperature of first solder 132 in joining units 128. For example, first solder 132 may incorporate an alloy having a melting temperature of about 325° C. –330° C., whereas the second solder 154 may incorporate an alloy having a melting temperature of about 220° C.–249° C. Proximal substrate 150 is assembled to the subassembly by engaging the joining units 128 with terminal 152 and with the first solder 154 thereon. As in the embodiments discussed above, the joining units 128 and terminals 126 can be displaced vertically to compensate for nonplanarity or misalignment of the substrate or component, or for any nonuniformity in the joining units, terminals or second solder 154. The joining units and second solder 154 are brought to a working temperature above the melting temperature of second solder 154 but below the melting temperature of first solder 132, as by heating the entire assembly to such temperature. Under these conditions, the second solder 154 wets the surface of first solder 132 and forms an integral solder body with first solder 132. The integral solder body includes a pad-side waist or narrow point remote from contact pad 152, formed by second solder 154 under the influence of surface tension effects similar to those discussed above. After bonding the joining units to the contact pads, the assembly can be inspected, as by optical inspection of the solder joints or electrical testing of the completed assembly. Those assemblies which are defective can be reworked by heating to an elevated disassembly temperature again above the melting temperature of second solder 154 but below the melting temperature of first solder 132 and pulling the subassembly or first element 132 away from the substrate or second element 150. Cores 130 and substantially all of first solder 132 will remain with subassembly or first element 102, whereas the second solder 154 tends to remain with substrate or second element 150. Thus, the individual components separated in the rework operation can be reused, typically without first addition of solder or joining units.

The interconnect pads 161 of the proximal substrate 150 are bonded to electrical connections 167 of a second or distal substrate 169 by a third bonding material, in this case a solder 165, having a third melting temperature lower than the second melting temperature of the pad bonding material or second solder 154. Here again, the assembly can be tested and reworked if necessary by heating to a second disassembly temperature higher than the third melting temperature of solder 165 but lower than the second melting temperature of solder 154, and pulling the distal substrate 169 away from the proximal substrate 150. The subassembly of the proximal substrate and microelectronic component 120 is substantially unaffected by such rework procedure.

Some useful materials are shown in Table I, below.

| Core | Coating on Core | First Solder Or Unit Bonding Material | Melting Temp. °C. |
|---|---|---|---|
| Copper | 90Sn/10Pb | 10Sn/90Pb | 325–330 |
| Copper | 63Sn/37Pb | 10Sn/90Pb | 325–330 |
| Copper | Au over Ni | 10Sn/88Pb/2Ag | 325–330 |
| Copper | Au over Pd—Ni | 10Sn/88Pb/2Ag | 325–330 |
| Bronze | 90Sn/10Pn | 10Sn/90Pb | 325–330 |
| Bronze | 63Sn/37Pb | 10Sn/90Pb | 325–330 |
| Bronze | Au over Ni | 10Sn/88Pb/2Ag | 325–330 |
| Bronze | Au over Pd—Ni | 10Sn/88Pb/2Ag | 325–330 |
| Nickel | 90Sn/10Pb | 10Sn/90Pb | 325–330 |
| Nickel | 63Sn/37Pb | 10Sn/90Pb | 325–330 |
| Nickel | Au (flash) | 10Sn/88Pb/2Ag | 325–330 |

| Second Solder or Pad-Bonding Material | Melting Temp. °C. | Third Solder or Bonding Material | Melting Temp. °C. |
|---|---|---|---|
| 96.5Sn/3.5Ag | 221–226 | 63Sn/37Pb | 185–190 |
| 95Sn/5Pb | 222–227 | 62Sn/36Pb/2Ag | 179–186 |
| 96Sn/4Ag | 238–243 | 62Sn/36Pb/2In | 179–185 |
| 95Sn/3.5Ag/1.5In | 218–223 | | |

Still further variations and combinations of the features described above can be utilized. For example, the joining units can be affixed to the terminals before the compliant layer is formed. Thus, the joining units can be applied before injection of the compliant material 149 between bumps 147. The joining units may be engaged by the platen during injection of the compliant material, so that the platen brings the joining units, as well as the terminals, to a substantially coplanar condition when the compliant layer is formed. Conversely, the compliant material 149 may be injected into the compliant layer after the joining units have been bonded to the substrate. The resilience of bumps 147 may support the terminals 126 above component 120 so that the terminals can be displaced toward the component during engagement of the joining units with the substrate. Indeed, according to the broad compass of the invention, other resilient elements can be substituted for the compliant layer. For example, the terminals can be movably supported above component 120 by the resilience of the leads themselves; by separately formed metallic spring elements; or by the flexible dielectric film.

Moreover, the configuration of the microelectronic component may vary from that illustrated. For example, the terminals may overly a surface of the microelectronic component other than the surface bearing the contacts. As illustrated in U.S. Pat. No. 5,347,159, a chip or other component may have terminals on one surface whereas a flexible film bearing terminals may wrap around a side of the chip or component so that the terminals overly the opposite surface of the chip. Also, the microelectronic component need not be a unitary chip. As shown in FIG. 4, the microelectronic component may include both a chip or other active component 200 and one or more auxiliary support elements 202 disposed alongside the chip. For example, the support elements may be formed as a ring-like structure 204 encircling the chip. Some or all of the terminals 220 may overly the support elements rather than the chip. The terminals are connected to the contacts 222 of the chip by leads 223 extending outwardly from the contacts on the chip in a so-called "fan-out" pattern. In other respects, the subassembly is similar to that illustrated in FIG. 3. Thus, the terminals 220 are disposed on a flexible film 224 which overlies a compliant layer 225, which in turn bears upon the chip and support elements. The terminals are connected to the contact pads of proximal substrate 250 by joining units 228 as discussed above.

In the arrangements discussed above, the unit bonding material is provided as a solder coating the solid core of the joining unit, so that the solder is applied at the interfaces between the terminals and the cores when the joining units are positioned on the terminals. However, other arrangements can be employed. For example, a unit bonding material or first solder can be applied to the terminals separately from the cores, as by application of a solder paste to the terminals. Joining units including the solid core, but omitting the unit bonding material, can be bonded to the terminals. In such an arrangement, the joining unit may be devoid of solder or else may include the pad bonding material or second solder used to bond with the contact pads of the substrate. In a further alternate arrangement, the unit bonding material may be formed in situ by diffusion or other interaction between the material of the core and the material of the terminal. For example, as shown in FIG. 5, a joining unit including a spherical core 330, desirably formed from a metal such as silver with a flash coating of gold, and an alloying element such as tin, silicon, germanium or combinations thereof at its exterior surface may be applied to a terminal 320 having gold at its exterior surface. Upon heating to a preselected bonding temperature, diffusion causes formation of a unit bonding material which is an alloy between the alloying element of the core and the gold of the terminal. This alloy initially has a low melting temperature, below the bonding temperature, and thus forms a liquid phase at the interface between the core and terminal. Continued exposure to the elevated temperate cause diffusion of the alloying element from the alloy, thus raises the melting temperature of the alloy or unit bonding material to a first melting temperature above the bonding temperature, causing the alloy to solidify. The pad bonding material or solder 333 used to connect the core to the contact pad of the substrate desirably has a second melting temperature above the first melting temperature, so that rework can be accomplished without remelting the first bonding material. In this context, the melting temperature of the unit bonding material should be taken as the melting temperature of the unit bonding material after resolidification, i.e., after formation of the solid bond between the core and terminal.

As these and other variations and combinations of the features discussed above can be employed, the foregoing description of the preferred embodiments should be taken by way of illustration rather than by way of limitation of the invention.

What is claimed is:

1. A microelectronic assembly comprising:
   (a) a microelectronic component having electrical contacts;
   (b) a plurality of terminals adjacent said component, each said terminal being connected to at least one contact of the component but movable relative to said component; and
   (c) a plurality of joining units, each said unit including a solid core disposed on one said terminal and extending upwardly therefrom; and
   (d) a unit bonding material having a first melting temperature securing each core to the terminal.

2. An assembly as claimed in claim 1 wherein said component has a top surface, said terminals overlie said top surface and each said terminal is movable with respect to said component in horizontal directions parallel to said top surface.

3. An assembly as claimed in claim 2 wherein each said terminal is vertically displaceable towards said top surface independently of other ones of said terminals.

4. An assembly as claimed in claim 2 or claim 3 further comprising a compliant layer disposed between said terminals and said component, said compliant layer being deformable to accommodate movement of said terminals and joining units relative to said component.

5. An assembly as claimed in claim 4 further comprising a flexible dielectric film disposed above said compliant layer, said terminals being mounted on said film.

6. An assembly as claimed in claim 5 wherein said compliant layer includes an adhesive material which bonds said film to said top surface of said component.

7. An assembly as claimed in claim 5 wherein said compliant layer includes an elastomer.

8. An assembly as claimed in claim 5 wherein said compliant layer includes a gel.

9. An assembly as claimed in claim 2 or claim 3 wherein said component includes a semiconductor chip and at least one support element disposed alongside said semiconductor chip, said at least one support element and said chip cooperatively defining the top surface of the component, at least some of said terminals overlying said at least one support element.

10. An assembly as claimed in claim 9 wherein said at least one support element includes a ring encircling the chip, said ring having a flat top surface forming a part of said top surface of said component.

11. An assembly as claimed in claim 1 or claim 2 or claim 3 further comprising a proximal substrate overlying said terminals and said joining units, said substrate having contact pads thereon, said joining units being bonded to said contact pads on said proximal substrate.

12. An assembly as claimed in claim 11 wherein said proximal substrate is substantially rigid.

13. An assembly as claimed in claim 11 further comprising a pad bonding material having a second melting temperature less than said first melting temperature, said joining units being bonded to said contact pads by said pad bonding material, whereby said proximal substrate can be removed from the assembly without disassembling said joining units from said terminals by heating the assembly to a first disassembly temperature above said second melting temperature but below said first melting temperature.

14. An assembly as claimed in claim 11 wherein said unit bonding material is a first solder and said pad bonding material is a second solder.

15. An assembly as claimed in claim 14 further comprising interconnect pads on said proximal substrate electrically connected to the contact pads of the proximal substrate, whereby said interconnect pads are also connected to the contacts of the microelectronic component through said joining units and terminals, the assembly further comprising a third solder on said interconnect pads, said third solder having a third melting temperature lower than said second melting temperature.

16. An assembly as claimed in claim 15 further comprising a distal substrate having electrical connections bonded to said interconnect pads of said proximal substrate by said third solder.

17. An assembly as claimed in claim 1 wherein each terminal includes a seat in the form of a surface of revolution about a vertical axis and wherein the core of each joining unit is engaged in the seat of the associated terminal.

18. An assembly as claimed in claim 1 wherein the unit bonding material of each said joining unit defines a terminal-side waist at which the horizontal dimensions of the unit bonding material are at a minimum, each said terminal-side waist being spaced above the terminal, said cores having melting or decomposition temperature above the first melting temperature of said unit bonding material.

19. An assembly as claimed in claim 18, further comprising a solder mask surrounding each said terminal, the terminal-side waist of each joining unit being disposed above the solder mask surrounding the associated terminal.

20. An assembly as claimed in claim 18, wherein each said core is substantially spherical.

21. An assembly as claimed in claim 5, wherein the unit bonding material of each joining unit extends horizontally outwardly on the associated terminal to the solder mask layer.

22. An assembly as claimed in claim 18, further comprising a proximal substrate having contact pads thereon disposed above said joining units, each said joining unit being bonded to one said contact pad, each said joining unit defining a pad-side waist remote from the contact pad.

23. A microelectronic subassembly comprising:
   (a) a first element defining a plurality of terminals, each said terminal including a generally conical seat;
   (b) a plurality of joining units, each said unit including a substantially spherical solid core engaged in the conical seat of said terminal and extending upwardly therefrom, whereby the centers of center said solid cores are aligned with said conical seat, and
   (c) solder extending over the terminal and over the core, said cores having a solidus temperature higher than the melting temperature of said solder.

24. An assembly as claimed in claim 23 wherein said first element includes a microelectronic component having contacts, each said terminal being connected to a contact of the component, the assembly further comprising a compliant layer disposed between said terminals and said component, each said terminal being movable relative to said component.

25. A microelectronic assembly comprising:
   (a) a first element defining a plurality of terminals;
   (b) a plurality of joining units disposed on said terminals and extending upwardly therefrom, each said unit including a solid core;
   (c) a unit bonding material extending between each terminal and core, said cores having a solidus temperature higher than the melting temperature of said unit bonding material;
   (d) a substrate having contact pads; and
   (e) a pad bonding material on said contact pads, said pad bonding material having a melting temperature less than the melting temperature of said unit bonding material, said joining units being bonded to said contact pads by said pad bonding material, whereby said substrate can be removed from the assembly without disassembling said joining units from said terminals by heating the assembly to a temperature above the melting temperature of said pad bonding material but below the temperature of said unit bonding material.

26. An assembly as claimed in claim 25 wherein said unit and pad bonding materials are first and second solders.

27. An assembly as claimed in claim 25 wherein said unit bonding material includes an alloy formed by diffusion bonding between said joining unit and said terminal and wherein said pad bonding material includes a solder.

* * * * *

UNITED STATES PATENT AND TRADEMARK OFFICE
CERTIFICATE OF CORRECTION

PATENT NO. : 5,801,446
DATED : September 1, 1998
INVENTOR(S) : DiStefano et al.

It is certified that error appears in the above-identified patent and that said Letters Patent is hereby corrected as shown below:

Column 13, line 28, "of center said" should read --of said--.

Signed and Sealed this

Twenty-fourth Day of November, 1998

Attest:

BRUCE LEHMAN

Attesting Officer

Commissioner of Patents and Trademarks